(12) United States Patent
Tazawa et al.

(10) Patent No.: US 12,482,707 B2
(45) Date of Patent: Nov. 25, 2025

(54) METHOD OF MANUFACTURING SEMICONDUCTOR DEVICE AND COLLET

(71) Applicant: Resonac Corporation, Tokyo (JP)

(72) Inventors: Tsuyoshi Tazawa, Tokyo (JP); Kei Itagaki, Tokyo (JP); Yoshinobu Ozaki, Tokyo (JP); Ayako Taira, Tokyo (JP)

( * ) Notice: Subject to any disclaimer, the term of this patent is extended or adjusted under 35 U.S.C. 154(b) by 419 days.

(21) Appl. No.: 17/639,914

(22) PCT Filed: Sep. 3, 2020

(86) PCT No.: PCT/JP2020/033457
§ 371 (c)(1),
(2) Date: Mar. 3, 2022

(87) PCT Pub. No.: WO2021/045157
PCT Pub. Date: Mar. 11, 2021

(65) Prior Publication Data
US 2022/0336281 A1 Oct. 20, 2022

(30) Foreign Application Priority Data

Sep. 6, 2019 (JP) .................................. 2019-163122

(51) Int. Cl.
*H01L 21/78* (2006.01)
*H01L 21/683* (2006.01)
*H01L 23/00* (2006.01)

(52) U.S. Cl.
CPC .......... *H01L 21/78* (2013.01); *H01L 21/6836* (2013.01); *H01L 24/75* (2013.01);
(Continued)

(58) Field of Classification Search
CPC ............. H01L 2224/94; H01L 2224/27; H01L 2224/75745; H01L 2924/00012;
(Continued)

(56) References Cited

U.S. PATENT DOCUMENTS 4,875,279 A * 10/1989 Sakiadis ............... H01L 24/743
156/497
2003/0049915 A1* 3/2003 Abe ........................ H01L 24/27
257/E21.705
(Continued)

FOREIGN PATENT DOCUMENTS

| CN | 109309039 | 2/2019 |
| JP | H1-235339 | 9/1989 |

(Continued)

OTHER PUBLICATIONS

International Search Report dated Nov. 17, 2020 for PCT/JP2020/033457.
(Continued)

*Primary Examiner* — Julio J Maldonado
*Assistant Examiner* — Stanetta D Isaac
(74) *Attorney, Agent, or Firm* — SOEI PATENT & LAW FIRM

(57) ABSTRACT

A collet for compressing an adhesive-attached chip, the collet including a main body having a first pressing surface to which a pressing force from a compressing device is directly transmitted, and a projecting portion projecting from the main body and having a second pressing surface provided along an outer circumference of the first pressing surface, the first pressing surface and the second pressing surface forming a holding surface for holding the adhesive-attached chip.

15 Claims, 13 Drawing Sheets

(52) U.S. Cl.
CPC .............. *H01L 24/83* (2013.01); *H01L 24/48* (2013.01); *H01L 24/73* (2013.01); *H01L 2224/48227* (2013.01); *H01L 2224/73265* (2013.01); *H01L 2224/75983* (2013.01); *H01L 2224/83201* (2013.01); *H01L 2224/8385* (2013.01)

(58) Field of Classification Search
CPC ......... H01L 2224/95; H01L 2224/9512; H01L 2224/95121; H01L 2224/95148; H01L 2224/96; H01L 2224/97; H01L 24/94; H01L 24/33; H01L 24/27; H01L 24/29; H01L 24/32; H01L 24/92; H01L 25/0657; H01L 25/50; H01L 23/562; H01L 23/3121; H01L 23/3135; H01L 2224/2919; H01L 2224/32145; H01L 2224/27003; H01L 2224/27436; H01L 2224/32225; H01L 2224/32245; H01L 2224/33181; H01L 2224/45099; H01L 2224/48091; H01L 2224/48245; H01L 2224/83191; H01L 2224/7531; H01L 2224/75312; H01L 2224/83203; H01L 2224/83204; H01L 2224/83862; H01L 2224/92165; H01L 21/78; H01L 21/6836; H01L 21/561; H01L 21/52; H01L 21/67144; H01L 21/67721
See application file for complete search history.

(56) References Cited

U.S. PATENT DOCUMENTS

| | | | | |
|---|---|---|---|---|
| 2003/0060021 | A1* | 3/2003 | Kurosawa | H01L 21/6836 438/455 |
| 2008/0128081 | A1* | 6/2008 | Wang | H01L 21/6838 156/60 |
| 2015/0303081 | A1* | 10/2015 | Hwang | H01L 21/67144 156/538 |
| 2017/0140948 | A1* | 5/2017 | Kimura | H01L 21/561 |
| 2017/0236798 | A1* | 8/2017 | Lee | H01L 24/75 156/378 |

FOREIGN PATENT DOCUMENTS

| | | |
|---|---|---|
| JP | H5-190665 | 7/1993 |
| JP | 2009-158718 | 7/2009 |
| JP | 2009-289785 | 12/2009 |
| JP | 2013-165219 | 8/2013 |
| JP | 6135202 | 5/2017 |
| JP | 2019-104863 | 6/2019 |
| JP | 2019-134020 | 8/2019 |
| WO | 2005/103180 | 11/2005 |

OTHER PUBLICATIONS

International Preliminary Report on Patentability with Written Opinion dated Mar. 17, 2022 for PCT/JP2020/033457.

* cited by examiner

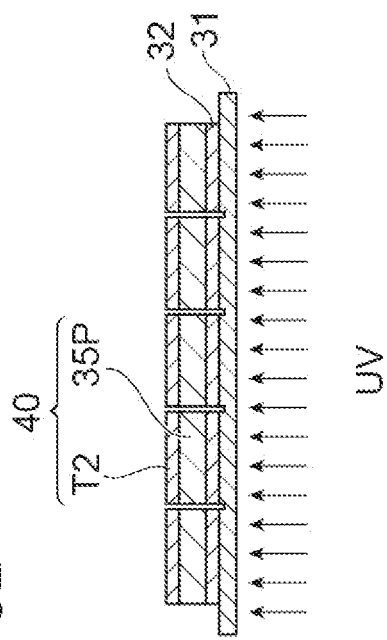
Fig.13A
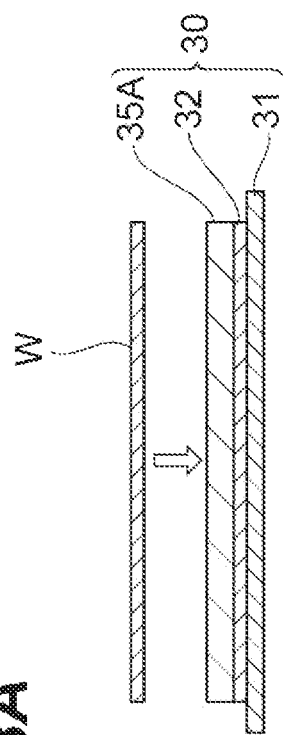
Fig.13B
Fig.13C
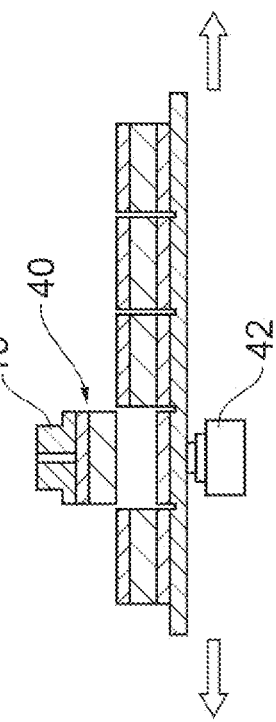
Fig.13D
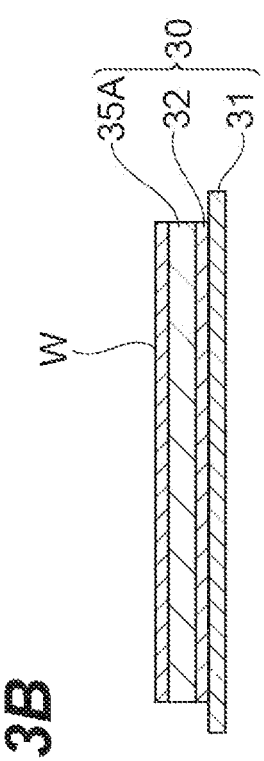
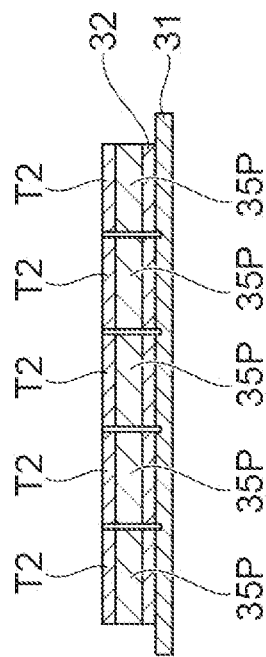
Fig.13E

METHOD OF MANUFACTURING SEMICONDUCTOR DEVICE AND COLLET

CROSS-REFERENCE TO RELATED APPLICATION

This application is a 35 U.S.C. § 371 national phase application of PCT/JP2020/033457, filed on Sep. 3, 2020, which claims priority to Japanese Patent Application No. 2019-163122, filed on Sep. 6, 2019.

TECHNICAL FIELD

The present disclosure relates to a method of manufacturing a semiconductor device and a collet used therein. Note that the collet is a tool used for picking up and compressing a semiconductor element in a manufacturing process of the semiconductor device.

BACKGROUND ART

With increasing functionality of electronic devices, stacked MCPs (Multi Chip Package) having high capacity by stacking semiconductor elements in multiple stages have become widespread. A film-shaped adhesive is widely used as a die-bonding adhesive for mounting a semiconductor element. An example of a multi-stage stacked package using the film-shaped adhesive is a wire-embedded package, which is applied to, for example, a memory package for a mobile phone or a portable audio device. The following semiconductor element is stacked using the film-shaped adhesive having a relatively high fluidity so that a wire connected to the semiconductor element is favorably embedded in the film-shaped adhesive.

In recent years, it has been emphasized to speed up the operation of the wire-embedded package. Conventionally, a controller chip for controlling the operation of a semiconductor device has been disposed in an uppermost stage of stacked semiconductor elements. However, to implement high-speed operation, a packaging technology for a semiconductor device in which a controller chip is disposed in a lowermost stage has been developed. As one form of such a package, a package in which a film-shaped adhesive used for compressing a second-stage semiconductor element among semiconductor elements stacked in multiple stages is thickened and a controller chip is embedded inside the film-shaped adhesive has been attracting attention. The film-shaped adhesive used for such applications is required to have high fluidity to be able to embed a step caused by unevenness of the controller chip, a wire connected to the controller chip, and a surface of a substrate. Patent Literature 1 discloses an adhesive sheet having a highly fluid adhesive layer. Patent Literature 2 discloses a method of manufacturing a semiconductor device using a film-shaped adhesive having low elasticity and low glass transition temperature after curing. According to this film-shaped adhesive, it is considered that even when a thin semiconductor element is used, warping of the semiconductor device can be suppressed, and excellent connection reliability can be obtained.

CITATION LIST

Patent Literature

Patent Literature 1: International Publication WO 2005/103180
Patent Literature 2: Japanese Patent No. 6135202

SUMMARY OF INVENTION

Technical Problem

Incidentally, with further miniaturization and thinning, multi-functionality, and high speed of the controller chip-embedded semiconductor device, the area of the controller chip tends to increase and the area of the second-stage semiconductor element tends to decrease. That is, the area occupied by the controller chip for the second-stage semiconductor element tends to increase. Further, there is a tendency that the second-stage semiconductor element is required to be further thinned, and the film-shaped adhesive in which the controller chip is embedded is also required to be thinned. In response to these trends, the following problems have become more prominent when manufacturing a package, especially when compressing a film for embedding a controller chip.

Voids remain around the controller chip after compressing (generation of voids).

Resin protrudes from the second-stage semiconductor element onto the substrate (occurrence of bleeding).

The second-stage semiconductor element warps due to insufficient removal of the resin on the controller chip (occurrence of bowing).

Some voids can be eliminated by a pressure curing process after compressing. However, the voids may not be eliminated when the voids are excessively large. Voids can cause peeling between the chip and the substrate or cracking of the package during reflow. Bleeding can contaminate a surrounding wire bonding pad or chip and cause deterioration of a wire bonding property. Bowing can make multi-stage stacking of chips difficult, and can cause the semiconductor element to peel off due to residual stress. Therefore, in a manufacturing process of the controller chip-embedded package, there is a strong demand for reduction of voids, bleeding and bowing after film compressing.

To solve these problems, various improvements have been made in terms of composition to control the fluidity of the film-shaped adhesive. However, bleeding tends to increase when the film is made highly fluid to reduce voids and bowing after compressing. On the other hand, when the film is made low in fluidity and bleeding is reduced, voids and bowing increase. As described above, there is a trade-off relationship between voids and bowing and bleeding, and it is becoming difficult to improve these problems only by improving the materials. Further, even when a process condition such as a compressing temperature or a compressing load is changed, for example, in high temperature and high load compressing, while the voids tend to decrease, the bleeding tends to increase, and it is difficult to improve the above problems at the same time.

The present disclosure has been made in view of the above circumstances, and provides a method of manufacturing a semiconductor device and a collet used therein, wherein the method is capable of reducing all of voids, bleeding, and bowing to a high level after a step of compressing a second-stage chip to embed a first-stage chip (for example, a controller chip) in a film-shaped adhesive.

Solution to Problem

A method of manufacturing a semiconductor device according to an aspect of the present disclosure comprises (A) mounting a first chip on a substrate, (B) attaching a wafer to an adhesive layer of a dicing/die-bonding integrated film comprising a base film, a pressure-sensitive adhesive layer, and the adhesive layer in order, (C) singulating the wafer to obtain a plurality of second chips, (D) picking up an adhesive-attached chip by using a collet, the adhesive-attached chip comprising the second chip and an adhesive piece obtained by singulating the adhesive layer, and (E) compressing the adhesive-attached chip onto the substrate so that the first chip is embedded in the adhesive piece. The collet used in the step (E) comprises a main body having a first pressing surface to which a pressing force from a compressing device is directly transmitted and a projecting portion having a second pressing surface provided along an outer circumference of the first pressing surface, the first pressing surface and the second pressing surface forming a holding surface for holding the adhesive-attached chip.

The present inventors focused on the collet used for compressing the second chip, and examined a reduction of voids, bleeding, and bowing. The present inventors have prototyped collets of various shapes, and have searched for a mode of a collet that can reduce all of voids, bleeding, and bowing to a high level. As a result, as described above, by forming the holding surface for the adhesive-attached chip by the first pressing surface of the main body and the second pressing surface of the projecting portion, the pressing force applied from the second pressing surface to a peripheral edge of the adhesive-attached chip can be relatively weakened. As a result, it was found that all of voids, bleeds and bowing can be reduced in a well-balanced manner. FIG. 1A and FIG. 1B are schematic cross-sectional views illustrating strength of a pressing force when compressing is performed using a collet by a size of an arrow. While a collet 10 illustrated in FIG. 1A has a main body 1 and a projecting portion 2, a collet 20 illustrated in FIG. 1B is a conventional collet not having a projecting portion. FIG. 1A illustrates a state in which occurrence of voids, bleeding, and bowing is sufficiently suppressed. On the other hand, FIG. 1B illustrates a state in which voids V, bleeding B, and bowing (warping of a second chip T2) occur.

It is preferable that an area of the first pressing surface is larger than an area of the first chip in a plan view and smaller than an area of the second chip in a plan view. From a viewpoint of reducing all of voids, bleeding, and bowing to a higher level, for example, the area of the first pressing surface is 20% to 90% of the area of the second chip in the plan view. From a similar viewpoint, it is preferable that the collet is made of a material having a shore A hardness of 30 to 95. For example, a thickness of the projecting portion may be 0.5 mm to 3.0 mm.

The collet may be used or does not have to be used for pick-up in the step (D). When the collet is not used for pick-up in the step (D), for example, the adhesive-attached chip may be picked up by another collet and then conveyed to an intermediate stage, and the adhesive-attached chip on the intermediate stage may be picked up by the collet and compressed to cover the first chip.

In the present disclosure, a thickness of the adhesive piece is 60 to 150 μm. When the thickness of the adhesive piece is 150 μm or less, bleeding can be reduced to a higher degree. A temperature at which a shear viscosity of the adhesive piece is 5000 Pas or less is, for example, 60 to 150° C. When this temperature is 150° C. or less, the adhesive piece becomes highly fluid without excessive heating in a compressing step, and both voids and bowing can be reduced to a higher degree.

Advantageous Effects of Invention

According to the present disclosure, there are provided a method of manufacturing a semiconductor device and a collet used therein, wherein the method is capable of reducing all of voids, bleeding, and bowing to a high level after a step of compressing a second-stage semiconductor element to embed the first-stage semiconductor element (for example, a controller chip) in a film-shaped adhesive.

BRIEF DESCRIPTION OF DRAWINGS

FIG. 1A illustrates a case where a collet having a projecting portion is used, and FIG. 1B illustrates a case where a collet not having a projecting portion is used.

FIG. 13A to FIG. 13E are cross-sectional views schematically illustrating a process of manufacturing the adhesive-attached chip.

DESCRIPTION OF EMBODIMENTS

Hereinafter, embodiments of the present disclosure will be described in detail, with reference to the drawings. However, the present invention is not limited to the following embodiments. Note that in the present specification, a word "step" is not limited to an independent step, and is included in this term as long as an intended action of the step is achieved even when the step cannot be clearly distinguished from other steps. A numerical range indicated using "to" refers to a range including numerical values described before and after "to" as a minimum value and a maximum value, respectively. In a numerical range described in stage in the present specification, an upper limit value or a lower limit value of a numerical range of one stage may be replaced with an upper limit value or a lower limit value of a numerical range in another stage. In a numerical range described in the present specification, an upper limit value or a lower limit value of the numerical range may be replaced with values described in Examples.

<Collet>

Figure 1A:
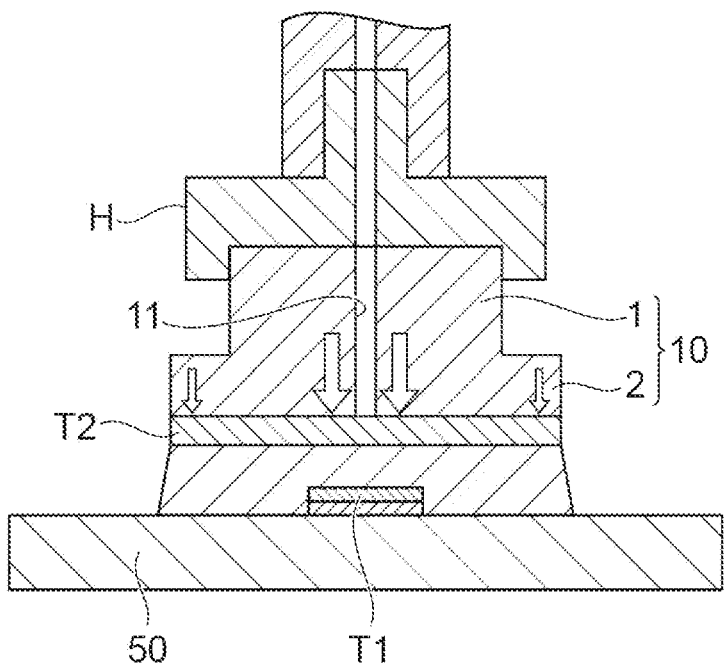
FIG. 1A and FIG. 1B are schematic cross-sectional views illustrating strength of a pressing force when compressing is performed using a collet by a size of an arrow.
Figure 1B:
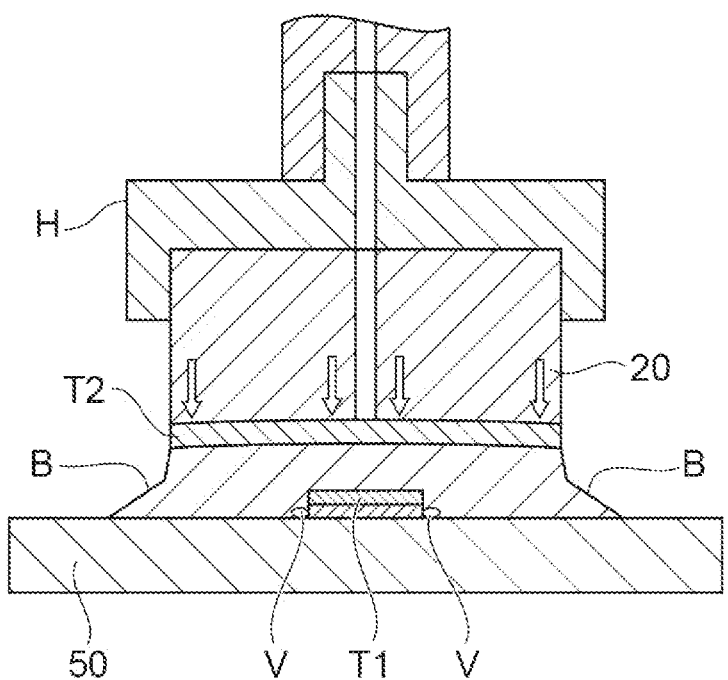

FIG. 1A is a schematic cross-sectional view illustrating a state in which a collet 10 having a projecting portion 2 is used to compress a second chip T2. The collet 10 is used for compressing the second chip T2 obtained through a step of singulating a semiconductor wafer W. Note that the second chip T2 and an adhesive piece 35P for embedding the first chip T1 form an adhesive-attached chip 40 (see FIG. 8).

Figure 2:
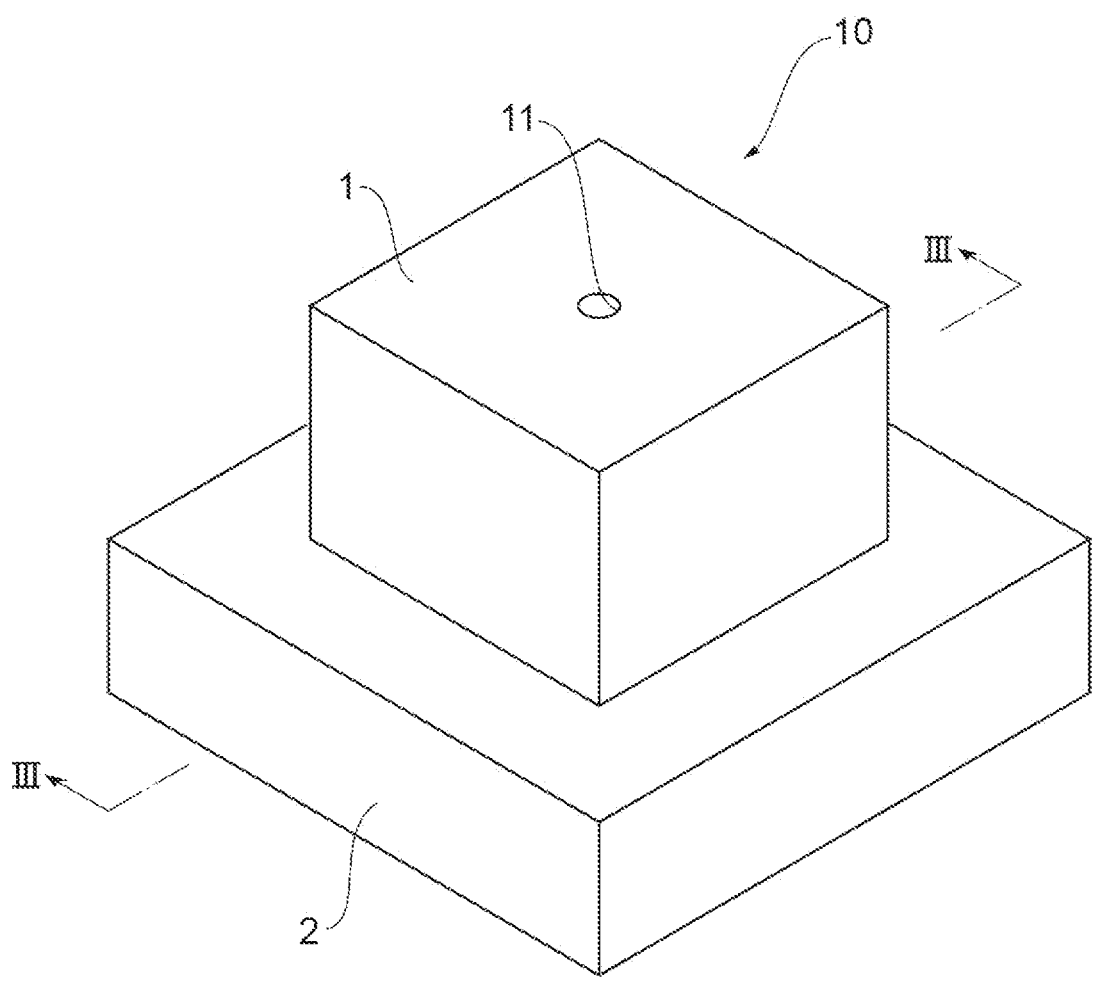
FIG. 2 is a perspective view of the collet illustrated in FIG. 1A.
Figure 3A:
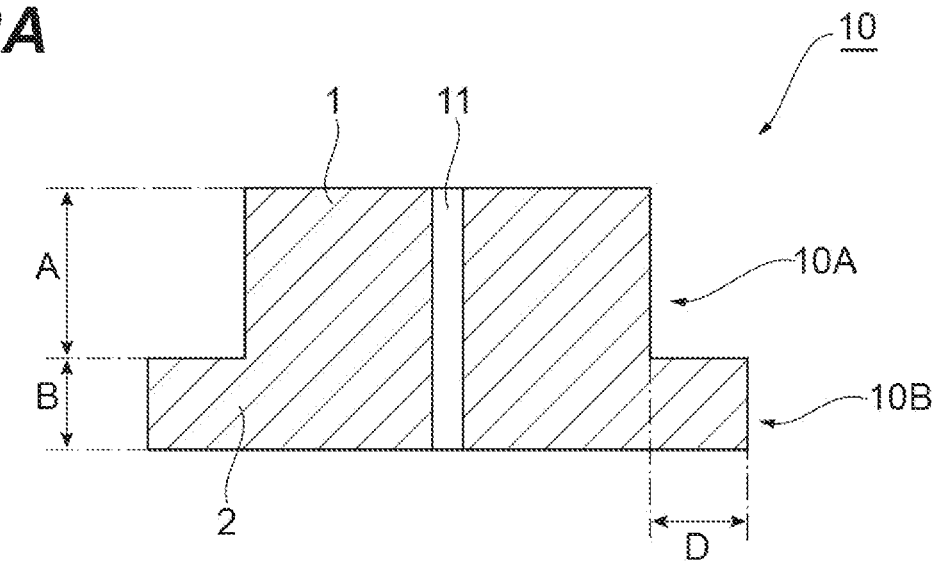
FIG. 3A is a cross-sectional view taken along the line of FIG. 2.
Figure 3B:
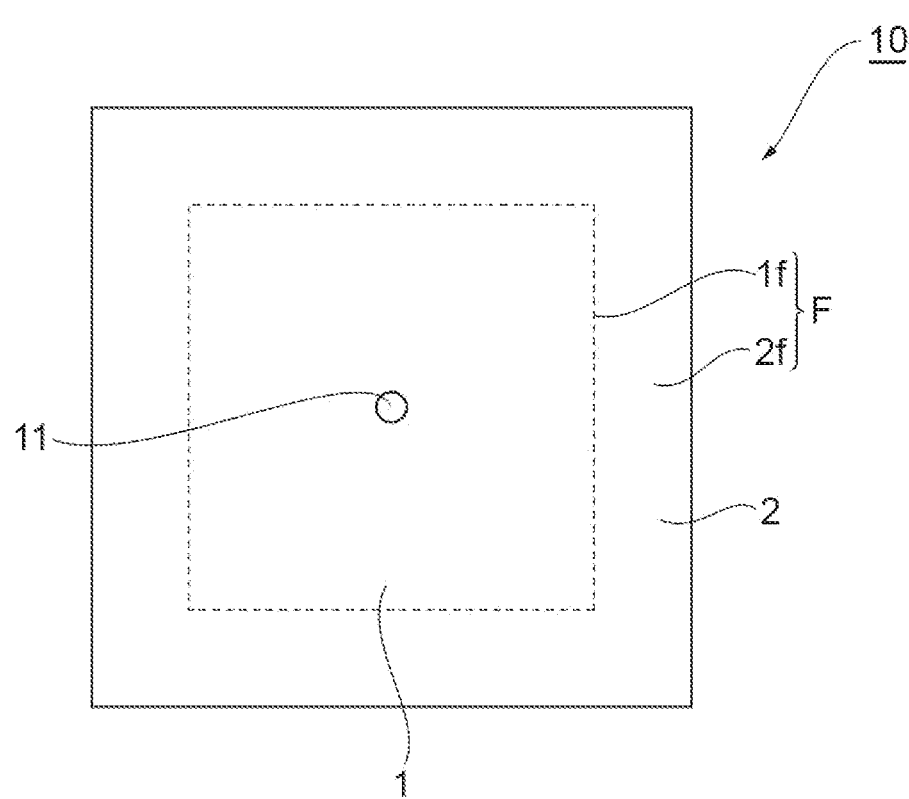
FIG. 3B is a bottom view of the collet illustrated in FIG. 1A.

FIG. 2 is a perspective view of the collet 10. FIG. 3A is a cross-sectional view taken along the line III-III of FIG. 2, and FIG. 3B is a bottom view of the collet 10. The collet 10 has a main body 1 and the projecting portion 2 provided on a lower end of the main body 1. An upper end of the main body 1 is housed in a collet holder H provided in a compressing device (see FIG. 1A). The lower end of the main body 1 has a first pressing surface 1*f* indicated by a broken line in FIG. 3. A pressing force from the compressing device (collet holder H) is directly transmitted to the first pressing surface 1*f*. The projecting portion 2 has a second pressing surface 2*f* forming a flat holding surface F together with the first pressing surface 1*f* of the main body 1. The second pressing surface 2*f* is provided along an outer circumference of the first pressing surface 1*f* and is flush with the first pressing surface 1*f*. Since the pressing force from the compressing device is transmitted to the second pressing surface 2*f* via the main body 1, the pressure applied to the second chip T2 becomes smaller than that applied to the first pressing surface 1*f*.

The first pressing surface 1*f* allows local pressure to be applied to a central portion of the second chip T2, effectively eliminating the film-shaped adhesive (adhesive piece 35P) on the first chip T1. As a result, voids around the first chip T1 can be suppressed, and bowing due to insufficient removal of an adhesive composition at the portion can be reduced. In addition, it is possible to reduce protrusion (bleeding) from an end portion of the second chip T2 to a substrate 50, since the pressure applied from the projecting portion 2 to a peripheral edge of the second chip T2 is relatively small. That is, according to the collet 10, a pressing force distribution suitable for compressing the second chip T2 is applied to the holding surface F.

A material of the collet 10 is, for example, rubber such as natural rubber or synthetic rubber. Examples of synthetic rubber include butyl rubber, styrene-butadiene rubber (SBR), isoprene rubber (IR), ethylene propylene rubber (EPM), ethylene propylene diene rubber (EPDM), urethane rubber, silicone rubber, and fluororubber. The collet 10 may have heat resistance according to a temperature condition used (for example, a compressing temperature), and, for example, may withstand a temperature of 50 to 200° C.

A shore A hardness of the collet 10 is preferably 30 to 95 and may be 40 to 90 or 50 to 80. When the shore A hardness of the collet 10 is within the above range, the second chip T2 can be compressed without being excessively deformed, and the second chip T2 can be picked up and compressed with less damage.

The collet 10 may be entirely formed of the same material (for example, rubber), or may be formed of a combination of a plurality of materials. In the latter case, for example, a lower portion 10B of the collet 10 (see FIG. 3A) coming into contact with the second chip T2 may be made of a material having a shore A hardness in the above range, and an upper portion 10A of the collet 10 (see FIG. 3A) may be made of a different material. For example, when the upper portion 10A is made of a material having a higher shore A hardness than that of the lower portion 10B, pressure can be locally applied by the central portion of the second chip T2 in a compressing step. In this case, when the shore A hardness of the lower portion 10B is within the above range, the second chip T2 can be picked up and compressed with less damage. Note that the lower portion 10B in the present embodiment comprises the projecting portion 2 and a portion which is a lower end portion of the main body 1 continuous with the projecting portion 2 and has the same thickness as that of the projecting portion 2. On the other hand, the upper portion 10A is a part of the main body 1 and refers to a portion extending from an upper end of the main body 1 to the lower portion 10B (that the upper portion 10A is a portion other than the lower portion 10B in the collet 10).

A shape of a cross section (first pressing surface 1*f*) of the main body 1 of the collet 10 corresponds to a shape of the first chip T1 and is a square in the present embodiment. When the first chip T1 has a rectangular shape, the shape of the cross section of the main body 1 of the collet 10 may be a rectangle. It is preferable that the area of the cross section of the main body 1 of the collet 10 is larger than the area of the first chip T1 and is smaller than the area of the second chip T2.

Specifically, the area of the first pressing surface 1*f* is preferably 20 to 90% of the area of the second chip T2, and may be 25 to 85% or 30 to 80% thereof. When the area of the first pressing surface 1*f* is in the above range, the pressure applied to the central portion and the end portion of the second chip T2 during compressing can be controlled, and the voids, bleeding, and bowing can be reduced in a more highly and balanced manner.

A shape of the holding surface F (outer circumference of the projecting portion 2) of the collet 10 corresponds to a shape of the second chip T2, and is a square in the present embodiment. When the second chip T2 has a rectangular shape, the shape of the holding surface F may be a rectangle. The area of the holding surface F of the collet 10 (the total area of the first pressing surface f1 and the second pressing surface f2) is preferably 70 to 110%, or may be 80 to 105% or 90 to 100% of the area of the second chip T2. When the area of the holding surface F is 70% or more of that of the second chip T2, sufficient pressure can be applied to the peripheral edge portion of the second chip T2, and generation of voids can be suppressed. On the other hand, when the area of the holding surface F is 110% or less of that of the second chip T2, it is possible to suppress occurrence of a pick-up error such as picking up an adjacent chip together with a chip to be picked up in a pick-up step.

A thickness of the upper portion 10A of the collet 10 (thickness A illustrated in FIG. 3A) is preferably 0.5 to 10 mm, more preferably 1 to 8 mm.

A thickness of the projecting portion 2 (lower portion 10B) of the collet 10 (thickness B illustrated in FIG. 3A) is preferably 0.5 to 3.0 mm, more preferably 0.75 to 2.75 mm, and even more preferably 1.0 to 2.5 mm. When the thickness of the projecting portion 2 is in the above range, the pressure applied to the central portion and the end portion of the second chip T2 during compressing can be controlled, and the voids, bleeding, and bowing can be reduced in a highly and balanced manner. In addition, when the thickness of the projecting portion 2 is 0.5 mm or more, the collet 10 has sufficient durability suitable for continuous use.

A projecting distance of the projecting portion 2 (distance D illustrated in FIG. 3A) is, for example, 0.5 to 4.0 mm, and may be 0.75 to 3.5 mm or 1.0 to 3.0 mm.

The upper portion 10A and the lower portion 10B of the collet 10 may or do not have to be aligned with each other in a plan view. In other words, a center of the first pressing surface f1 and a center of the holding surface F may or do not have to be aligned. For example, when an alignment function of the compressing device is used, picking up and the compressing are performed in a state where the center of the holding surface F of the collet 10 and the center of the second chip T2 are aligned. The upper portion 10A and the lower portion 10B of the collet 10 are preferably disposed so that the centers thereof are aligned when projected in a vertical direction as illustrated in FIG. 3B. In this case, in a semiconductor device designed so that the centers of the second chip T2 and the first chip T1 are aligned, the most reduction effect can be expected for voids, bleeding, and bowing. Note that even in a semiconductor device designed so that the centers of the second chip T2 and the first chip T1 are not aligned, when the first chip T1 is contained within the first pressing surface f1, a reduction effect for the problem can be expected. Meanwhile, a collet used for manufacturing a semiconductor device in which the centers of the second chip T2 and the first chip T1 are not aligned is given as an example in which it is preferable that the centers of the upper portion 10A and the lower portion 10B of the collet 10 are not aligned. In this case, during compressing of the second chip T2, the center of the upper portion 10A (first pressing surface f1) may be aligned with the center of the first chip T1.

Figure 4A:
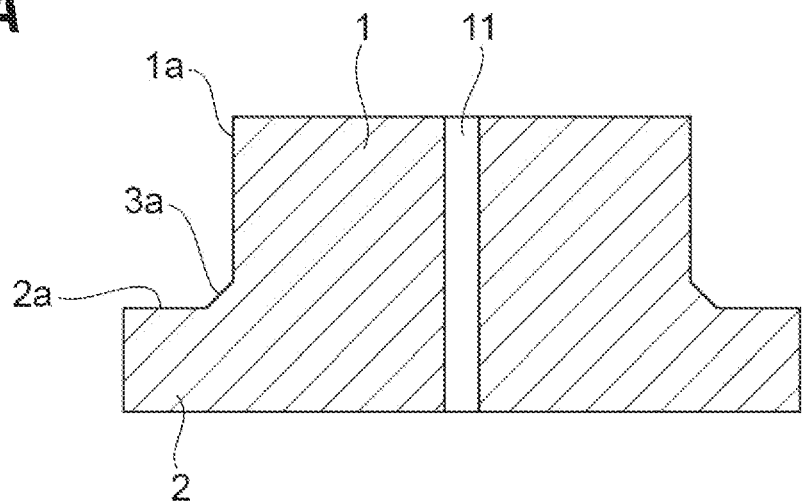
FIG. 4A and FIG. 4B are schematic cross-sectional views, each of which illustrates a modification of the collet illustrated in FIG. 1A.
Figure 4B:
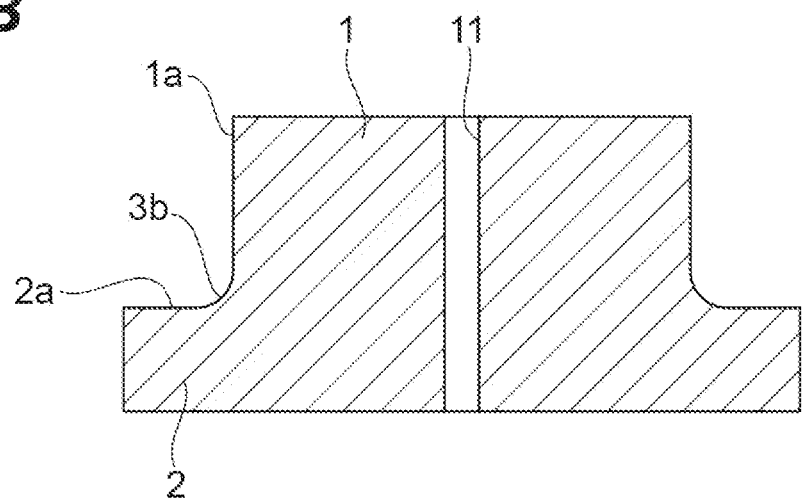

As illustrated in FIG. 3A, for example, a side surface 1a of the main body 1 and an upper surface 2a of the projecting portion 2 are orthogonal to each other, in other words, an angle formed by the both surfaces is 90°. Note that as illustrated in FIG. 4A and FIG. 4B, an inclined portion may be provided at a boundary between the side surface 1a of the main body 1 and the upper surface 2a of the projecting portion 2. The inclined portion 3a illustrated in FIG. 4A comprises a flat surface, while the inclined portion 3b illustrated in FIG. 4B comprises a curved surface.

The collet 10 has a hole 11 provided to penetrate the main body 1 from an upper end to a lower end. The hole 11 is used to hold the second chip T2 by a suction force in the pick-up step and the compressing step. A diameter of the hole 11 is, for example, 0.1 to 1.0 mm. When the diameter of the hole 11 is 0.1 mm or more, the second chip T2 can be sufficiently held by the suction force, and when the diameter is 1.0 mm or less, a decrease in the pressing force due to the hole 11 can be suppressed, and generation of voids can be sufficiently suppressed.

Figure 5A:
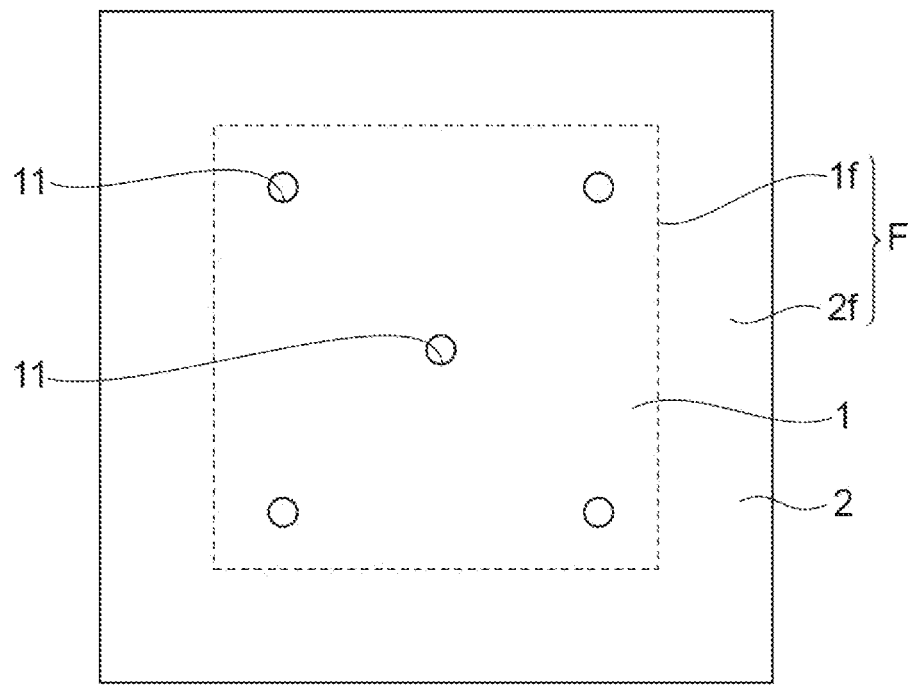
FIG. 5A and FIG. 5B are bottom views, each of which illustrates a modification of the collet illustrated in FIG. 1A.
Figure 5B:
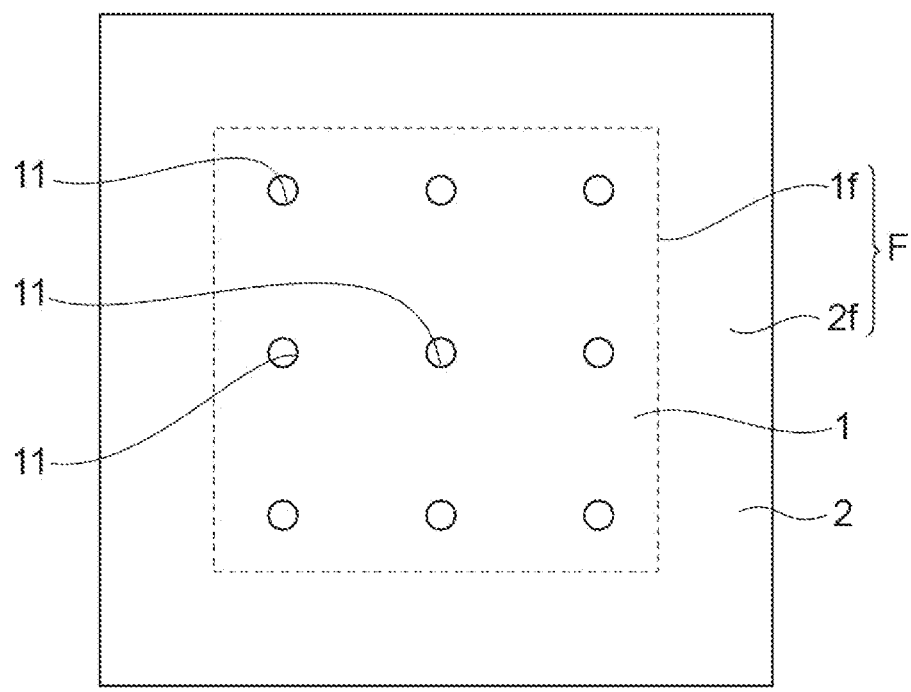
Figure 6A:
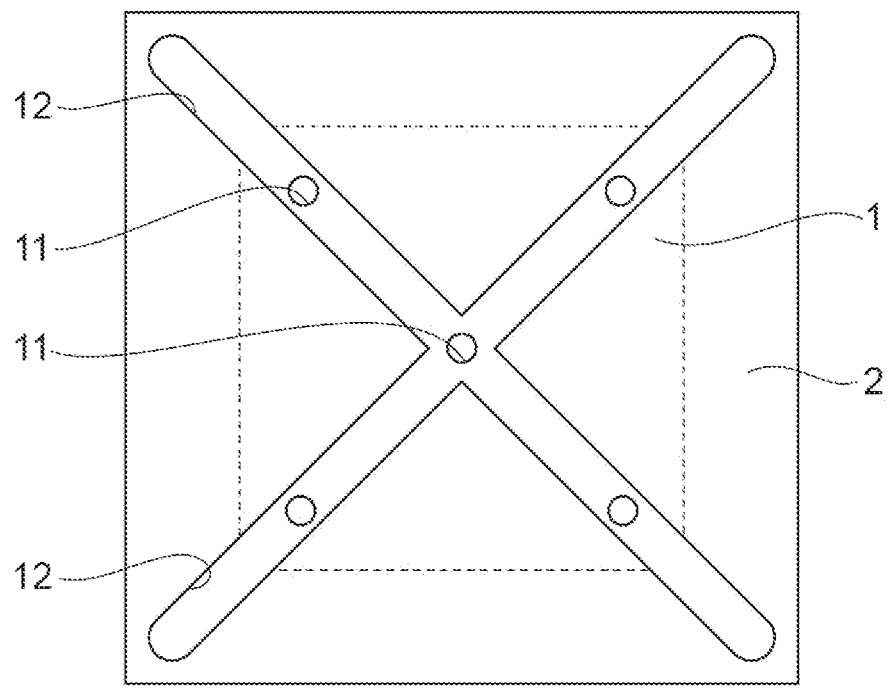
FIG. 6A and FIG. 6B are bottom views illustrating the modifications of the collet illustrated in FIG. 5A and FIG. 5B, respectively.
Figure 6B:
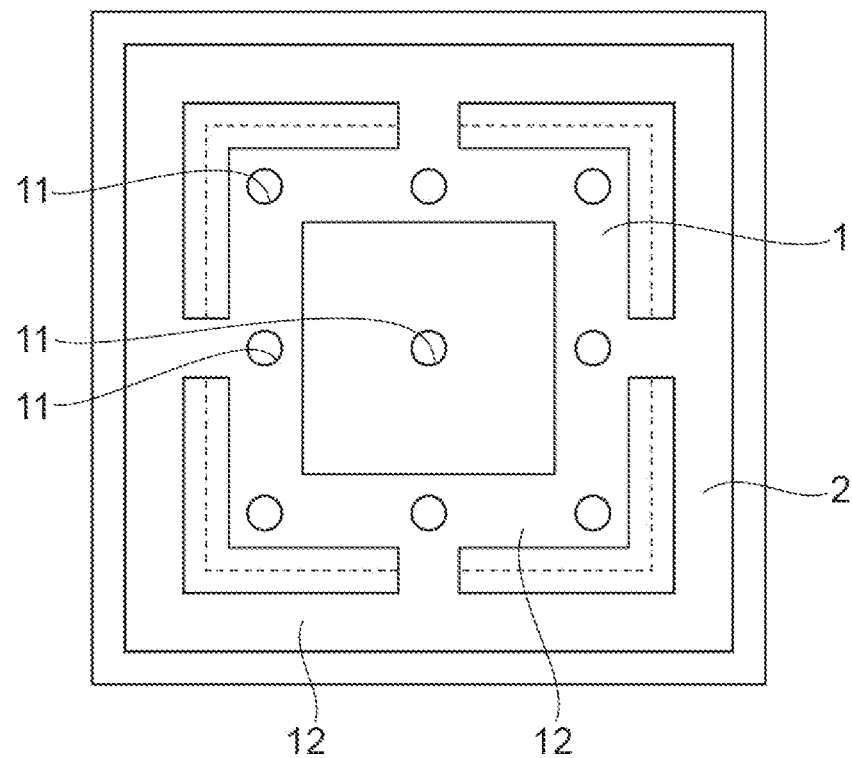

To increase the suction force of the collet, for example, as illustrated in FIG. 5A and FIG. 5B, a plurality of (for example, five or nine) holes 11 may be provided in the main body 1. To increase a holding force of the holding surface F, as illustrated in FIG. 6A and FIG. 6B, a groove 12 connected to the hole 11 and reaching the projecting portion 2 may be provided on the holding surface F.

The same collet 10 may be used in the pick-up step and the compressing step, or different collets may be used. When different collets are used in the pick-up step and the compressing step, a pick-up collet (not illustrated) picks up the second chip T2 and then transfers the second chip T2 to an intermediate stage (not illustrated). Thereafter, the collet 10 (compressing collet) sucks and holds the second chip T2 on the intermediate stage, transfers the second chip T2 onto the substrate, and compresses the second chip T2. In this case, since the pick-up step and the compressing step are performed in parallel, productivity is high. Further, the second chip T5 can be easily sucked and transferred from the intermediate stage since the second chip T5 is previously peeled off from a pressure-sensitive adhesive layer 32 (FIG. 13). Therefore, the compressing collet 10 may have a lower suction force than that of the pick-up collet.

<Semiconductor Device>

Figure 7:
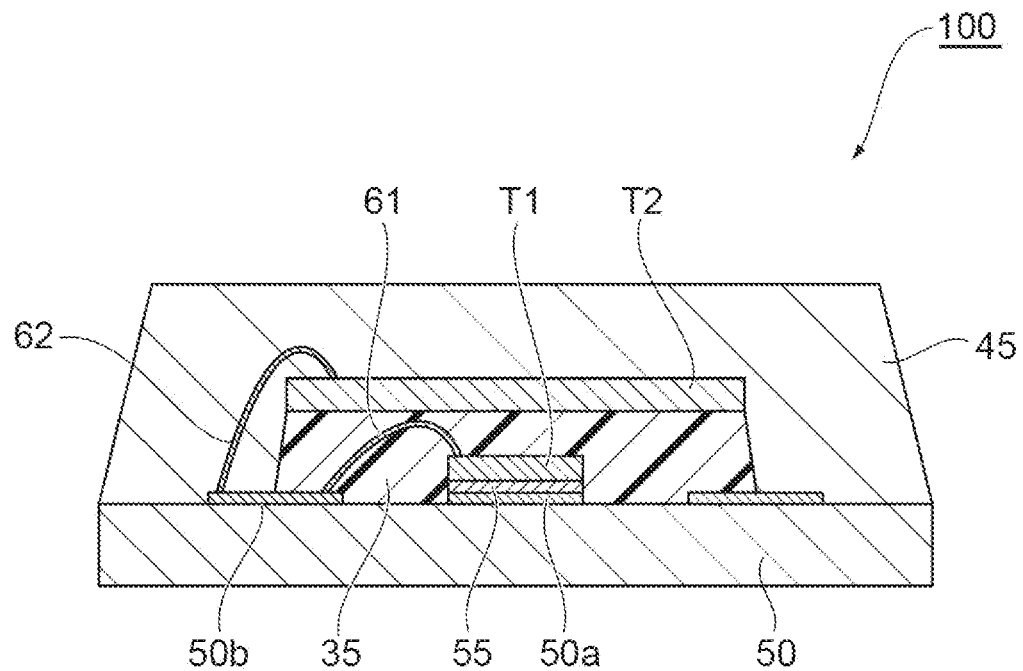
FIG. 7 is a cross-sectional view schematically illustrating an example of a semiconductor device.

FIG. 7 is a cross-sectional view schematically illustrating a semiconductor device manufactured by using the collet 10. The semiconductor device 100 illustrated in this figure is referred to as a chip-embedded type, and comprises the substrate 50, the first chip T1 mounted on a surface of the substrate 50, a first sealing layer 35 (cured product of an adhesive piece) in which the first chip T1 is embedded, the second chip T2 disposed above the first chip T1, and a second sealing layer 45 sealing the second chip T2

The substrate 50 has circuit patterns 50a and 50b on a surface. From a viewpoint of suppressing warping of the semiconductor device 100, a thickness of the substrate 50 is, for example, 90 to 180 µm, and may be 90 to 140 µm. Note that the substrate 50 may be an organic substrate or a metal substrate such as a lead frame.

The first chip T1 is a controller chip for driving the semiconductor device 100. The first chip T1 is attached to the circuit pattern 50a via an adhesive 55, and is connected to the circuit pattern 50b via a wire 61. The shape of the first chip T1 in a plan view is, for example, a square or a rectangle. A length of one side of the first chip T1 is, for example, 10 mm or less, and may be 2 to 5 mm or 0.5 to 4 mm A thickness of the first chip T1 is, for example, 10 to 170 µm, and may be 20 to 100 µm.

The second chip T2 has a larger area than that of the first chip T1. The second chip T2 is mounted on the substrate 50 via the first sealing layer 35 so that the entire first chip T1 and a part of the circuit pattern 50b are covered. A shape of the second chip T2 in a plan view is, for example, a square or may be a rectangle. A length of one side of the second chip T2 is, for example, 20 mm or less, and may be 3 to 18 mm, 4 to 15 mm, or 4 to 12 mm A thickness of the second chip T2 is, for example, 20 to 400 µm, and may be 20 to 120 µm. The second chip T2 is connected to the circuit pattern 50b via a wire 62 and is sealed by the second sealing layer 45.

Figure 8:
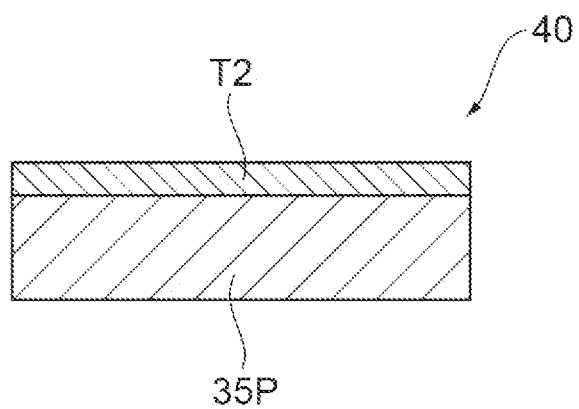
FIG. 8 is a cross-sectional view schematically illustrating an example of an adhesive-attached chip comprising an adhesive piece and a second chip.

The first sealing layer 35 comprises a cured product of the adhesive piece 35P (see FIG. 8). Note that as illustrated in FIG. 8, the adhesive piece 35P and the second chip T2 have substantially the same size. In FIG. 8, the adhesive-attached chip 40 comprises the adhesive piece 35P and the second chip T2. The adhesive-attached chip 40 is manufactured through a dicing step and the pick-up step as described later (see FIG. 13).

<Method of Manufacturing Semiconductor Device>

Figure 9:
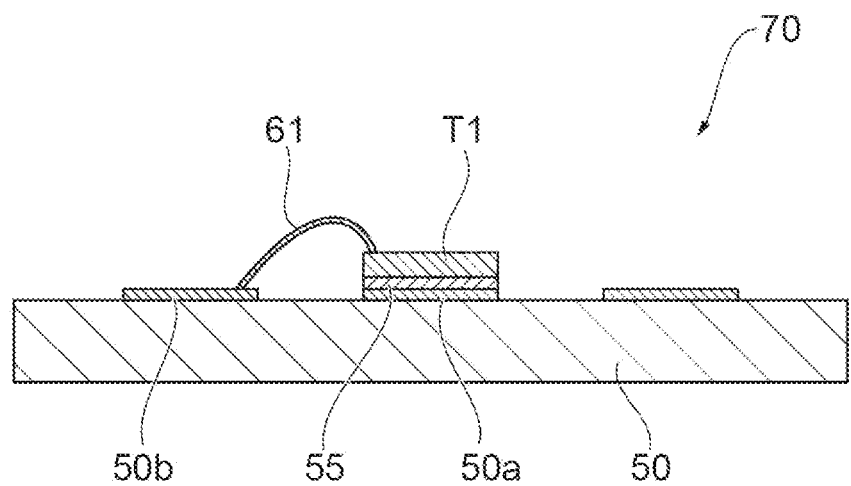
FIG. 9 is a cross-sectional view schematically illustrating a process of manufacturing a semiconductor package illustrated in FIG. 7.

A method of manufacturing the semiconductor device 100 will be described. First, as illustrated in FIG. 9, a structure 70 comprising the substrate 50 and the first chip T1 mounted on the substrate 50 is manufactured. That is, the first chip T1 is disposed on a surface of the substrate 50 via the adhesive 55. Thereafter, the first chip T1 and the circuit pattern 50b are electrically connected by the wire 61.

Figure 10:
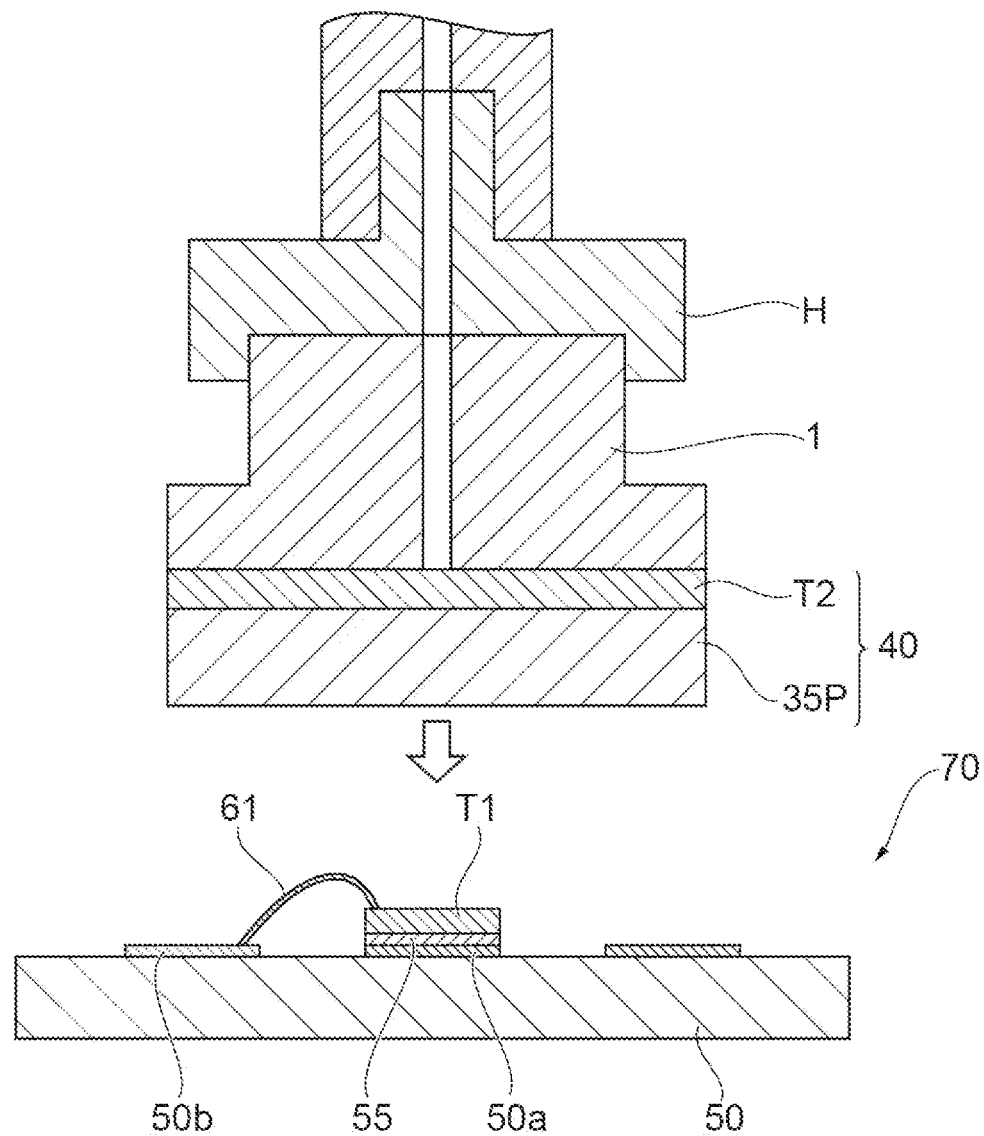
FIG. 10 is a cross-sectional view schematically illustrating a process of manufacturing the semiconductor package illustrated in FIG. 7.

Next, as illustrated in FIG. 10, the adhesive piece 35P of the adhesive-attached chip 40 is compressed to the substrate 50 using the collet 10. As a result, the first chip T1 and the wire 61 are embedded in the adhesive piece 35P.

A thickness of the adhesive piece 35P may be appropriately set according to the thickness of the first chip T1, for example, 60 to 150 µm, and may be 70 to 140 µm or 75 to 135 µm. A shear viscosity of the adhesive piece 35P at 80° C. is preferably, for example, 500 Pas or more, and may be 800 Pas or more or 1000 Pas or more. A temperature at which the shear viscosity of the adhesive piece 35P is 5000 Pas or less is preferably in a range of 60 to 150° C.

Figure 11:
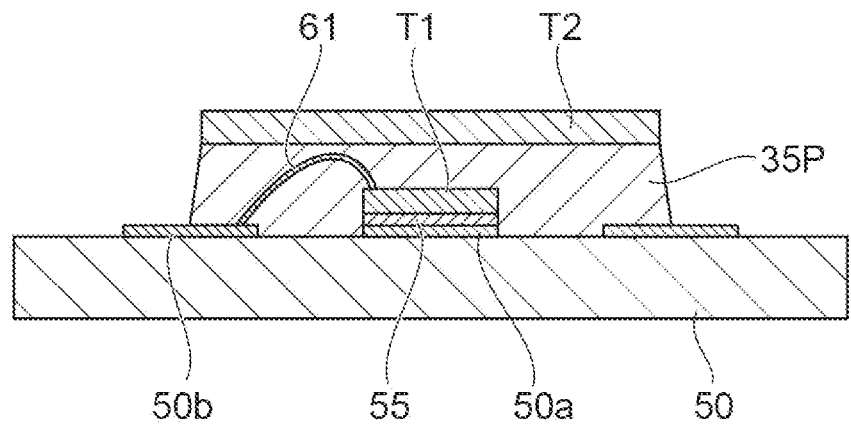
FIG. 11 is a cross-sectional view schematically illustrating a process of manufacturing the semiconductor package illustrated in FIG. 7.

A compressing temperature of the adhesive piece 35P with respect to the substrate 50 is preferably 50 to 200° C., more preferably 80 to 150° C. When the compressing temperature is moderately high, the viscosity of the adhesive piece 35P decreases and the fluidity increases, so that an embedding property for steps, etc. of the first chip T1, the wire 61, the circuit patterns 50a and 50b on the surface of the substrate 50, etc. is improved. Further, since wettability of the adhesive piece 35P with the first chip T1 and the substrate 50 is improved, an interfacial adhesive force tends to be improved. Note that when the compressing temperature is excessively high, the fluidity of the adhesive piece 35P increases, and thus protrusion (bleeding) of an adhesive composition (adhesive piece 35P) from the end portion of the second chip T2 onto the substrate 50 tends to increase. A compressing time is preferably 0.5 to 10 seconds, more preferably 1 to 5 seconds. Through the compressing step, as illustrated in FIG. 11, the first chip T1 and the wire 61 are embedded in the adhesive piece 35P.

Figure 12:
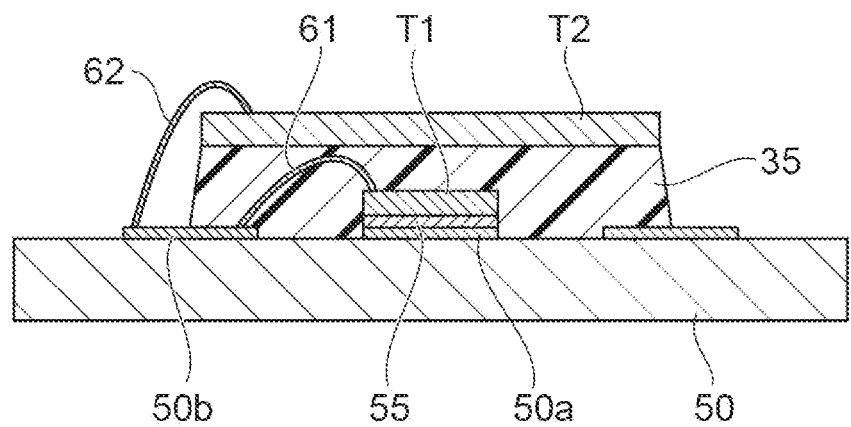
FIG. 12 is a cross-sectional view schematically illustrating a process of manufacturing the semiconductor package illustrated in FIG. 7.

Next, the adhesive piece 35P is cured by heating. As a result, the adhesive piece 35P becomes a cured product (first sealing layer 35) (FIG. 12). A curing temperature can be set to, for example, about 50 to 250° C. A curing time can be set to, for example, 10 seconds to 3 hours. To eliminate voids remaining after the compressing step, pressurization may be performed under a condition of 0.3 to 0.9 MPa during the above heating. The semiconductor device 100 is completed by electrically connecting the second chip T2 and the circuit pattern 50b by the wire 62 and then sealing the second chip T2 by the second sealing layer 45 (see FIG. 7).

<Method of Manufacturing Adhesive-Attached Chip>

An example of a method of manufacturing the adhesive-attached chip 40 illustrated in FIG. 8 will be described with reference to FIG. 13A to FIG. 13E. First, a dicing die bonding integrated film 30 (hereinafter, referred to as "film 30" in some cases) is disposed in a predetermined device (not illustrated). The film 30 comprises a base film 31, the pressure-sensitive adhesive layer 32, and an adhesive layer 35A in this order. The base film 31 is, for example, a polyethylene terephthalate film (PET film). The semiconductor wafer W is, for example, a thin semiconductor wafer having a thickness of 20 to 120 μm. The semiconductor wafer W may be single crystal silicon or a compound semiconductor such as polycrystalline silicon, various ceramics, or gallium arsenide. Note that the film 30 may further comprise a protective film (not illustrated) provided to cover the adhesive layer 35A.

As illustrated in FIG. 13A and FIG. 13B, the film 30 is attached so that the adhesive layer 35A is in contact with one surface of the semiconductor wafer W. This step is preferably carried out under a temperature condition of 50 to 120° C., more preferably 60 to 100° C. When the temperature is 50° C. or higher, an excellent adhesion property of the semiconductor wafer W to the adhesive layer 35A can be obtained, and when the temperature is 120° C. or lower, excessive flow of the adhesive layer 35A is suppressed in this step.

As illustrated in FIG. 13C, the semiconductor wafer W, the pressure-sensitive adhesive layer 32, and the adhesive layer 35A are diced. As a result, the semiconductor wafer W is disassembled to become the second chip T2. The adhesive layer 35A is disassembled to become the adhesive piece 35P. Examples of a dicing method include a method using a rotary blade or a laser. Note that the semiconductor wafer W may be thinned by grinding the semiconductor wafer W prior to dicing the semiconductor wafer W.

Next, when the pressure-sensitive adhesive layer 32 is, for example, an ultraviolet curable type, as illustrated in FIG. 13D, the pressure-sensitive adhesive layer 32 is cured by irradiating the pressure-sensitive adhesive layer 32 with ultraviolet rays to decrease an adhesive force between the pressure-sensitive adhesive layer 32 and the adhesive piece 35P. After irradiation with ultraviolet rays, as illustrated in FIG. 13E, while expanding the base film 31 to separate second chips T2 from each other, the adhesive-attached chip 40 is peeled off from the pressure-sensitive adhesive layer 32 by pushing up with a needle 42, and the adhesive-attached chip 40 is sucked and picked up by the collet 10. As illustrated in FIG. 10, the adhesive-attached chip 40 obtained in this way is used for manufacturing the semiconductor device 100. Note that as described above, another collet may be used instead of the collet 10 to pick up the adhesive-attached chip 40. Further, when the pressure-sensitive adhesive layer 32 is a pressure-sensitive type, it is unnecessary to carry out ultraviolet irradiation.

EXAMPLES

Hereinafter, examples of the present disclosure will be described. However, the invention is not limited to these examples.

Example 1

(Compressing for First Chip)

HR-5104T-10 (adhesive layer thickness 10 μm) manufactured by Hitachi Kasei Co., Ltd. was attached to a semiconductor wafer (12 inches) having a thickness of 60 μm at 65° C. Subsequently, HR-5104T-10 and the semiconductor wafer were blade-diced to 5 mm×5 mm to obtain adhesive piece-attached first chips. An adhesive piece-attached first chip was compressed onto a substrate. DB800-HSD manufactured by Hitachi High-Technologies Corporation was used for compressing. Compressing conditions were set to a temperature of 120° C., a time of 1.0 s, and a pressure of 0.2 MPa. As the substrate, a substrate having a thickness of 130 μm and having a solder resist (AUS308) formed on the surface was used. After compressing, the adhesive piece was pressure-cured under conditions of a temperature of 140° C., a pressure of 0.7 MPa, and a time of 1 h. A fully automatic pressure oven PCOA-01T manufactured by NTT Advanced Technology Co., Ltd. was used for curing.

(Compressing for Second Chip)

A controller chip embedding film FH-4013T-120 (adhesive layer thickness 120 μm) manufactured by Hitachi Kasei Co., Ltd. was attached to a semiconductor wafer (12 inches) having a thickness of 60 μm at 65° C. Subsequently, the controller chip embedding film and the semiconductor wafer were blade-diced to 10 mm×10 mm to obtain adhesive piece-attached second chips. Subsequently, an adhesive piece-attached second chip was compressed onto a substrate provided with the first chip. Compressing conditions were a temperature of 120° C., a time of 1.5 s, and a pressure of 0.2 MPa.

Compressing device: DB800-HSD (manufactured by Hitachi High-Technologies Corporation)
Collet
  Shape of holding surface: 10 mm×10 mm square
  Shape of first pressing surface: 5 mm×5 mm square
  Projecting distance: 2.5 mm (distance D illustrated in FIG. 3A)
  Thickness of upper portion of collet: 4 mm (thickness A illustrated in FIG. 3A)

Thickness of lower portion of collet (projecting portion): 2 mm (thickness B illustrated in FIG. 3A)
Material: Rubber of shore A hardness 70
Position and number of suction holes: one in center of main body
Diameter of suction hole: 0.5 mmϕ

After compressing by the collet, the adhesive piece was pressure-cured under conditions of a temperature of 140° C., a pressure of 0.7 MPa, and a time of 1 h. As a result, a sample according to Example 1 was obtained. A fully automatic pressure oven PCOA-01T manufactured by NTT Advanced Technology Corporation was used for curing.

Example 2

A sample was obtained similarly to Example 1 except that a collet (projecting distance: 2.0 mm) whose first pressing surface is a 6 mm×6 mm square was used for compressing an adhesive piece-attached second chip (size: 10 mm×10 mm).

Example 3

A sample was obtained similarly to Example 1 except that a collet (projecting distance: 1.5 mm) whose first pressing surface is a 7 mm×7 mm square was used for compressing an adhesive piece-attached second chip (size: 10 mm×10 mm).

Example 4

A sample was obtained similarly to Example 1 except that a collet (projecting distance: 1.0 mm) whose first pressing surface is a 8 mm×8 mm square was used for compressing an adhesive piece-attached second chip (size: 10 mm×10 mm).

Examples 5 to 8

Samples according to Examples 5 to 8 were obtained similarly to Examples 1 to 4, respectively, except that a collet in which a thickness of a projecting portion is 1.5 mm was used for compressing an adhesive piece-attached second chip (size: 10 mm×10 mm).

Comparative Example 1

A sample was obtained similarly to Example 1 except that the following collet was used for compressing an adhesive piece-attached second chip (size: 10 mm×10 mm)
Shape of holding surface: 5 mm×5 mm square
Projecting portion: none
Thickness of main body: 4 mm Comparative Example 2

A sample was obtained similarly to Example 1 except that a collet (without projecting distance) whose holding surface is a 6 mm×6 mm square was used for compressing an adhesive piece-attached second chip (size: 10 mm×10 mm).

Comparative Example 3

A sample was obtained similarly to Example 1 except that a collet (without projecting distance) whose holding surface is a 7 mm×7 mm square was used for compressing an adhesive piece-attached second chip (size: 10 mm×10 mm).

Comparative Example 4

A sample was obtained similarly to Example 1 except that a collet (without projecting distance) whose holding surface is a 8 mm×8 mm square was used for compressing an adhesive piece-attached second chip (size: 10 mm×10 mm).

Comparative Example 5

A sample was obtained similarly to Example 1 except that a collet (without projecting distance) whose holding surface is a 10 mm×10 mm square was used for compressing an adhesive piece-attached second chip (size: 10 mm×10 mm)
(Evaluation of Voids)

An ultrasonic digital diagnostic imaging device (IS-350, manufactured by Insight Co., Ltd.) was used to observe the samples (after compressing and after pressure curing) according to the examples and the comparative examples by a transmission method, thereby evaluating voids. The observation was performed under the following conditions.
Transmitter probe: 35 MHz
Receiver probe: 25 MHz
Scan length
X: 240 mm
Y: 70 mm
Pitch: 0.1 mm In an obtained observation image, a void portion appears black. Only a chip portion of 10 mm×10 mm was cut out using Photoshop (registered trademark, manufactured by Adobe Systems Co., Ltd.) and binarized. A portion not having a void was in white, a portion having a void was in black, and a void rate was calculated by a ratio thereof. The number of samples was set to N=4, and an average value was set to the void rate. Based on a void rate of the sample (after compressing) according to Comparative Example 5, a void improving effect of a sample (after compressing) according to another test example was calculated by the following formula.

Void improving effect (%)=[(Void rate of Comparative Example 5)−(Void rate of another test example)]/(Void rate of Comparative Example 5)×100

(Evaluation of Bleeding)

A microscope (STMT-LF, manufactured by Olympus Corporation) was used to measure the amount of bleeding of the samples according to the examples and the comparative examples (protrusion distance of the adhesive from the end portion of the second chip). A top, bottom, left, and right of the second chip were observed, and a maximum value of each side was recorded. The number of samples was set to N=4, and a value obtained by averaging the maximum value of each side was defined as the amount of bleeding. Based on the amount of bleeding of the sample (after pressure curing) according to Comparative Example 5, a bleeding improving effect of a sample (after pressure curing) according to another test example was calculated by the following formula.

Bleeding improving effect (%)=[(Amount of bleeding of Comparative Example 5)−(Amount of bleeding of another test example)]/(Amount of bleeding of Comparative Example 5)×100

(Evaluation of Bowing)

A digimatic indicator (ID-H0530, manufactured by Mitutoyo Co., Ltd.) was used to measure the amount of bowing of the samples according to the examples and the comparative examples. That is, measurement points were the upper left, upper right, center, lower left, and lower right of the second chip, and a value obtained by subtracting a minimum value from a maximum value was defined as the amount of bowing. The number of samples was set to N=4, and an average value was defined as the amount of bowing. Based on the amount bowing of the sample (after pressure curing) according to Comparative Example 5, a bowing improving effect of a sample (after pressure curing) according to another test example was calculated by the following formula.

Bowing improving effect (%)=[(Amount of bowing of Comparative Example 5)−(Amount of bowing of another test example)]/(Amount of bowing of Comparative Example 5)×100

Evaluation results are shown in Tables 1 and 2. Evaluations in the tables are based on the following criteria.

Value of Void Improving Effect of Sample after Compressing
  S: 50% or more
  A: 30% or more and less than 50%
  B: 20% or more and less than 30%
  C: 10% or more and less than 20%
  D: less than 10%

Presence or Absence of Void in Sample after Pressure Curing
  A: No void
  D: Void present Value of Bleeding Improving Effect after Pressure Curing
  S: 50% or more
  A: 30% or more and less than 50%
  B: 20% or more and less than 30%
  C: 10% or more and less than 20%
  D: less than 10%

Value of Bowing Improving Effect after Pressure Curing
  S: 30% or more
  A: 20% or more and less than 30%
  B: 10% or more and less than 20%
  C: 0% or more and less than 10%
  D: less than 0%

As shown in Table 1, in all the examples except the voids after compressing of Example 1, improvement effects could be confirmed in all of the voids, bleeding, and bowing compared to Comparative Example 5. In Example 1, the void rate after compressing slightly deteriorated. However, voids could disappear after pressure curing. A reason for deterioration of the void rate after compressing in Example 1 is considered as follows. The surface of the main body of the collet (first pressing surface) was 5 mm×5 mm, which was excessively small for the second chip of 10 mm×10 mm, so that the vicinity of the end portion of the second chip could not be pressed during compressing. In addition, with regard to the voids, when the surface of the main body was 6 mm×6 mm and 7 mm×7 mm, there was a tendency for further improvement than that of 8 mm×8 mm. It is considered that when the surface of the main body is small, more pressure is applied to the central portion of the second chip, and the resin on the upper portion of the first chip can be eliminated. A reason is presumed that the voids were less likely to be trapped since the resin flowed around the second chip, or since warping of the second chip in an upward convex direction during compressing was reduced.

It was found that bleeding tends to improve as the surface of the main body of the collet becomes smaller. A reason therefor is considered as follows. When the surface of the main body becomes smaller, the pressure applied to the end portion of the semiconductor chip decreases, or it becomes easier to eliminate the resin on the upper portion of the first chip, warping of the second chip in the upward convex direction during compressing is reduced, and a timing when the end portion of the adhesive piece-attached second chip comes into contact with the substrate is delayed.

Similarly to bleeding, it was found that bowing tends to improve as the surface of the main body of the collet becomes smaller. It is considered that when the surface of the main body is small, more pressure is applied to the central portion of the second chip, and the resin on the upper portion of the first chip can be eliminated, so that warping of the second chip in the upward convex direction is reduced, and bowing is reduced. It was confirmed that a thinner projecting portion tends to slightly bring improvement. As a reason therefor, it is considered that as the projecting portion becomes thinner, the pressure applied to the end portion of the second chip becomes lower.

The collets used in Comparative Examples 1 to 5 have conventionally known shapes. When the holding surface is 5 mm×5 mm or 6 mm×6 mm, bowing is significantly improved. However, due to the small holding surface, voids remained at a tip portion (corner portion) of the semiconductor chip after compressing and could not disappear after pressure curing. In addition, a significant deterioration in bleeding was found. A cause is considered as follows. The pressure applied to the semiconductor chip became high due to the small holding surface, and the resin on the upper portion and around the controller chip excessively flowed.

TABLE 1

|  |  | Ex. 1 | Ex. 2 | Ex. 3 | Ex. 4 | Ex. 5 | Ex. 6 | Ex. 7 | Ex. 8 |
| --- | --- | --- | --- | --- | --- | --- | --- | --- | --- |
| Collet | Holding surface (mm × mm) | 10 × 10 | 10 × 10 | 10 × 10 | 10 × 10 | 10 × 0 | 10 × 10 | 10 × 10 | 10 × 10 |
|  | First pressing surface (mm × mm) | 5 × 5 | 6 × 6 | 7 × 7 | 8 × 8 | 5 × 5 | 6 × 6 | 7 × 7 | 8 × 8 |
|  | Ratio (%) of area of first pressing surface to area of second chip | 25 | 36 | 49 | 64 | 25 | 36 | 49 | 64 |
|  | Thickness (mm) of upper portion of collet | 4 | 4 | 4 | 4 | 4 | 4 | 4 | 4 |
|  | Protrusion distance (mm) | 2.5 | 2.0 | 1.5 | 1.0 | 2.5 | 2.0 | 1.5 | 1.0 |
|  | Thickness (mm) of lower portion of collet | 2.0 | 2.0 | 2.0 | 2.0 | 1.5 | 1.5 | 1.5 | 1.5 |
|  | Ratio (%) of area of holding surface to area of second chip | 100 | 100 | 100 | 100 | 100 | 100 | 100 | 100 |

TABLE 1-continued

|  |  |  | Ex. 1 | Ex. 2 | Ex. 3 | Ex. 4 | Ex. 5 | Ex. 6 | Ex. 7 | Ex. 8 |
|---|---|---|---|---|---|---|---|---|---|---|
| Voids | After compressing | Void rate (%) | 5.5 | 1.1 | 2.4 | 3.2 | 3.1 | 0.7 | 2.7 | 3.6 |
|  |  | Improving effect (%) | −3.8 | 79.2 | 54.7 | 39.6 | 41.5 | 86.8 | 49.1 | 32.1 |
|  |  | Evaluation | D | S | S | A | A | S | A | A |
|  | After pressure curing | Void rate (%) | 0 | 0 | 0 | 0 | 0 | 0 | 0 | 0 |
|  |  | Evaluation | A | A | A | A | A | A | A | A |
| Bleeding | After pressure curing | Amount (μm) of bleeding | 34.1 | 69.7 | 87.0 | 104.4 | 40.1 | 71.8 | 78.6 | 96.5 |
|  |  | Improving effect (%) | 72.9 | 44.6 | 30.8 | 17.0 | 68.1 | 42.9 | 37.5 | 23.3 |
|  |  | Evaluation | S | A | A | C | S | A | A | B |
| Bowing | After pressure curing | Amount (μm) of bowing | 44.3 | 45.3 | 46.0 | 46.8 | 42.3 | 41.3 | 45.3 | 45.8 |
|  |  | Improving effect (%) | 18.7 | 16.9 | 15.6 | 14.1 | 22.4 | 24.2 | 16.9 | 16.0 |
|  |  | Evaluation | B | B | B | B | A | A | B | B |

TABLE 2

|  |  |  | Comp. Ex. 1 | Comp. Ex. 2 | Comp. Ex. 3 | Comp. Ex. 4 | Comp. Ex. 5 |
|---|---|---|---|---|---|---|---|
| Collet |  | Pressing surface (mm × mm) | 5 × 5 | 6 × 6 | 7 × 7 | 8 × 8 | 10 × 10 |
|  |  | Ratio (%) of area of pressing surface to area of second chip | 25 | 36 | 49 | 64 | 100 |
|  |  | Thickness (mm) of main body | 4 | 4 | 4 | 4 | 4 |
| Voids | After compressing | Void rate (%) | 14.5 | 1.9 | 2.7 | 3.8 | 5.3 |
|  |  | Improving effect (%) | −173.6 | 64.2 | 49.1 | 28.3 | — |
|  |  | Evaluation | D | S | A | B | — |
|  | After pressure curing | Void rate (%) | 0.6 | 0.2 | 0 | 0 | 0 |
|  |  | Evaluation | D | D | A | A | — |
| Bleeding | After pressure curing | Amount (μm) of bleeding | 174.9 | 238.8 | 91.1 | 107.3 | 125.8 |
|  |  | Improving effect (%) | −39.0 | −89.8 | 27.6 | 14.7 | — |
|  |  | Evaluation | D | D | B | C | — |
| Bowing | After pressure curing | Amount (μm) of bowing | 27.5 | 33.0 | 44.0 | 49.8 | 54.5 |
|  |  | improving effect (%) | 49.5 | 39.4 | 19.3 | 8.6 | — |
|  |  | Evaluation | S | S | B | C | — |

INDUSTRIAL APPLICABILITY

According to the present disclosure, there are provided a method of manufacturing a semiconductor device and a collet used therein, wherein the method is capable of reducing all of voids, bleeding, and bowing to a high level after a step of compressing a second-stage semiconductor element to embed the first-stage semiconductor element (for example, a controller chip) in a film-shaped adhesive.

REFERENCE SIGNS LIST

1: main body, 2: projecting portion, 3a, 3b: inclined portion, 10: collet, 10A: upper portion, 10B: lower portion, 11: hole, 12: groove, 30: dicing die bonding integrated film, 31: base film, 32: pressure-sensitive adhesive layer, 35: first sealing layer, 35A: adhesive layer, 35P: adhesive piece, 40: adhesive-attached chip, 45: second sealing layer, 50: substrate, 100: semiconductor device, F: holding surface, f1: first pressing surface, f: second pressing surface, H: collet holder (compressing device), T1: first chip, T2: second chip, W: semiconductor wafer.

The invention claimed is:

1. A method of manufacturing a semiconductor device, the method comprising:
    mounting a first chip on a substrate;
    attaching a wafer to an adhesive layer of a dicing/die-bonding integrated film comprising a base film, a pressure-sensitive adhesive layer, and the adhesive layer in order;

singulating the wafer to obtain a plurality of second chips;

picking up an adhesive-attached chip by using a first collet, the adhesive-attached chip comprising a second chip among the plurality of second chips, and an adhesive piece obtained by singulating the adhesive layer;

positioning the adhesive piece of the adhesive-attached chip to face the first chip on the substrate, wherein the adhesive piece is located between the first chip and the second chip; and compressing the adhesive-attached chip against the substrate to embed the first chip into the adhesive piece that is located between the first chip and the second chip, by applying a pressing force from a compressing device to a second collet, wherein the second collet has a holding surface that has a greater area than an area of the first chip and that transmits a first pressure to a central portion of the adhesive-attached chip and a second pressure to a peripheral edge of the adhesive-attached chip, and wherein the first pressure is greater than the second pressure to suppress a deformation at the peripheral edge of the adhesive-attached chip when the first chip is embedded into the adhesive piece of the adhesive-attached chip.

2. The method according to claim 1, wherein the second collet is made of an elastic material having a shore A hardness of 30 to 95 that reduces the pressing force received from the compressing device, to the second pressure.

3. The method according to claim 1, wherein a thickness of the adhesive piece is 60 to 150 μm.

4. The method according to claim 1, wherein a temperature at which a shear viscosity of the adhesive piece is 5000 Pas or less is within a range of 60 to 150° C.

5. The method according to claim 1, wherein the second collet is used as the first collet for picking up the adhesive-attached chip.

6. The method according to claim 1,
wherein the second collet includes:
a main body forming a first pressing surface that applies the first pressure by directly transmitting the pressing force from the compressing device; and
a projecting portion projecting from the main body and forming a second pressing surface that extends along an outer periphery of the first pressing surface, the first pressing surface and the second pressing surface forming the holding surface for the adhesive-attached chip, wherein the second pressing surface applies the second pressure, and
wherein the projecting portion is spaced away from the compressing device when the compressing device applies the pressing force to the second collet, to cause the first pressure to be greater than the second pressure, per surface unit of the adhesive-attached chip.

7. The method according to claim 6,
wherein an area of the second chip of the adhesive-attached chip is larger than an area of the first chip in a plan view of the second collet, wherein an area of the first pressing surface is larger than the area of the first chip and smaller than the area of the second chip, in the plan view, and wherein when compressing the adhesive-attached chip, the first pressing surface entirely overlaps the first chip and the holding surface of the second collet entirely overlaps the second chip, in the plan view.

8. The method according to claim 6, wherein an area of the first pressing surface is 20% to 90% of an area of the second chip in a plan view of the second collet.

9. The method according to claim 6,
wherein the pressing force is applied in a vertical direction that is orthogonal to the holding surface,
wherein a thickness of the projecting portion in the vertical direction is 0.5 mm to 3.0 mm, and
wherein the main body has a greater thickness than the projecting portion, in the vertical direction, to space apart the projecting portion from the compressing device, so as to cause the main body to apply the first pressure that is greater than the second pressure.

10. A collet for compressing an adhesive-attached chip, the collet comprising:
a main body forming a first pressing surface configured to apply a first pressure to a central portion of the adhesive-attached chip by directly transmitting the pressing force from a compressing device; and
a projecting portion forming a second pressing surface extending along a periphery of the first pressing surface, wherein the first pressing surface and the second pressing surface form a holding surface for the adhesive-attached chip, and wherein the projecting portion is made of an elastic material having a shore A hardness of 30 to 95 that dampens the pressing force to cause the second pressing surface to apply a second pressure to a peripheral edge of the adhesive-attached chip, that is less than the first pressure.

11. The collet according to claim 10, wherein the projecting portion is configured to be spaced away from the compressing device when the main body transmits the pressing force from the compressing device, to apply the second pressure that is less than the first pressure.

12. The collet according to claim 11, wherein the projecting portion forms an upper surface opposite the second pressing surface, that is stepped from the main body, to avoid contact with the compressing device.

13. The collet according to claim 10, wherein the main body and the projecting portion are both made of the material having the shore A hardness of 30 to 95.

14. The collet according to claim 10,
wherein the holding surface forms a flat surface, and
wherein the first pressing surface and the second pressing surface are both configured to contact the adhesive-attached chip at the holding surface.

15. The collet according to claim 10, wherein the main body forms at least one through-hole extending in the vertical direction of the collet to cause the holding surface to hold the adhesive-attached chip by suction, in addition to compressing the adhesive-attached chip.

* * * * *